United States Patent
Faber

(10) Patent No.: US 8,790,105 B2
(45) Date of Patent: Jul. 29, 2014

(54) APPARATUS FOR MANUFACTURING STAMP PRINTING BLOCKS

(75) Inventor: Ernst Faber, Wels (AT)

(73) Assignee: Colop Stempelerzeugung Skopek Gesellschaft m.b.H. & Co. KG., Wels (AT)

( * ) Notice: Subject to any disclaimer, the term of this patent is extended or adjusted under 35 U.S.C. 154(b) by 54 days.

(21) Appl. No.: 13/441,042

(22) Filed: Apr. 6, 2012

(65) Prior Publication Data

US 2012/0263814 A1 Oct. 18, 2012

(30) Foreign Application Priority Data

Apr. 13, 2011 (AT) .................................. A 525/2011

(51) Int. Cl.
*B29C 35/08* (2006.01)

(52) U.S. Cl.
USPC .......................... 425/174.4; 425/385; 264/293

(58) Field of Classification Search
CPC ................ B29C 2035/0833; B29C 2035/0827
USPC .......................... 425/174.4, 385; 264/293, 494
See application file for complete search history.

(56) References Cited

U.S. PATENT DOCUMENTS

| | | | |
|---|---|---|---|
| 3,033,980 A * | 5/1962 | Pickering et al. ............. | 362/294 |
| 3,604,798 A | 9/1971 | Gerson | |
| 4,821,052 A * | 4/1989 | Mitsuya et al. ............... | 399/337 |
| 5,134,469 A * | 7/1992 | Uchimura ...................... | 348/68 |
| 5,611,279 A | 3/1997 | Ando et al. | |
| 5,873,308 A | 2/1999 | Taira | |
| 6,241,505 B1 * | 6/2001 | Buazza et al. ............. | 425/174.4 |
| 6,700,692 B2 * | 3/2004 | Tonar et al. .................... | 359/265 |
| 6,775,492 B2 * | 8/2004 | Miyakoshi et al. ............. | 399/92 |
| 7,068,361 B2 * | 6/2006 | Cimino et al. ................. | 356/213 |
| 7,974,564 B2 * | 7/2011 | Hamaba et al. ............... | 399/336 |
| 8,092,209 B2 * | 1/2012 | Ando et al. .................... | 425/385 |
| 8,104,402 B2 | 1/2012 | Feilecker et al. | |
| 2002/0102098 A1 * | 8/2002 | Camm et al. .................. | 392/416 |
| 2003/0147666 A1 * | 8/2003 | Miyakoshi et al. ............. | 399/93 |
| 2007/0091062 A1 * | 4/2007 | French et al. ................. | 345/107 |
| 2007/0133652 A1 * | 6/2007 | Siegel ............................. | 374/31 |
| 2008/0181684 A1 * | 7/2008 | Hamaba et al. ............... | 399/322 |

(Continued)

FOREIGN PATENT DOCUMENTS

DE 38 29 555 A1 12/1989
DE 91 06 621 U1 7/1991

(Continued)

OTHER PUBLICATIONS

Austrian Office Action dated Jan. 13, 2012 in Austrian Patent Application No. A 525/2011, along with an English translation of same.

(Continued)

*Primary Examiner* — Joseph S Del Sole
*Assistant Examiner* — Nahida Sultana
(74) *Attorney, Agent, or Firm* — Collard & Roe, P.C.

(57) ABSTRACT

An apparatus for manufacturing stamp printing blocks by a local exposure and heating of a stamp plate blank made of a porous thermoplastic material; with the apparatus includes at least one exposure lamp which is arranged in a housing below a glass plate support for the blank; the glass plate support is formed by two glass plates which are arranged on top of each other in a spaced apart manner, thereby forming a gap between them.

7 Claims, 3 Drawing Sheets

(56) References Cited

U.S. PATENT DOCUMENTS

| | | |
|---|---|---|
| 2009/0008828 A1 | 1/2009 | Humal |
| 2009/0295006 A1* | 12/2009 | Kawakami ............... 264/40.1 |
| 2011/0024948 A1* | 2/2011 | Takaya et al. ............ 264/293 |

FOREIGN PATENT DOCUMENTS

| | | | | |
|---|---|---|---|---|
| EP | 0 805 745 | 11/1997 | | |
| EP | 0 810 100 | 12/1997 | | |
| EP | 1 976 705 | 10/2008 | | |
| FR | 2 004 049 A1 | 11/1969 | | |
| JP | H01-307758 A | 12/1989 | | |
| JP | 2009181617 | * 8/2009 | ............ | G11B 5/84 |
| WO | WO 96/22874 A1 | 8/1996 | | |
| WO | WO2009081586 A1 | * 7/2009 | ............ | B29C 33/40 |

OTHER PUBLICATIONS

European Search Report dated Oct. 16, 2012 in European Application No. 12 450 019.0 with English translation of relevant parts.

* cited by examiner

APPARATUS FOR MANUFACTURING STAMP PRINTING BLOCKS

CROSS REFERENCE TO RELATED APPLICATIONS

Applicant claims priority under 35 U.S.C. §119 of German Application No. A 525/2011 filed on Apr. 13, 2011, the disclosure of which is incorporated by reference.

FIELD OF INVENTION

The invention refers to an apparatus for manufacturing stamp printing blocks (which sometimes are also called 'stereotype blocks', 'printing plates' or 'text plates') by a local exposure and heating of a stamp plate blank made of a porous thermoplastic material, comprising at least one exposure lamp which is arranged in a housing below a glass plate support for the blank.

BACKGROUND OF INVENTION

In practice, such an apparatus is also called "flash machine". In said technique, for the manufacture of a stamp plate, in an open-pored foam material, as for instance EVA (ethylene vinyl acetate), a closing of the pores of the open-pored material of the stamp plate blank is caused by means of short exposures ("flash", in particular of xenon lamps) in those regions where no stamp imprint shall be created. In those regions where a stamp imprint shall be created with the aid of stamping ink permeating through the porous material, however, the pores remain open.

Such a flash stamp is for instance described in EP 1 976 705 E1.

An apparatus for the manufacture of such a flash stamp plate, or more specifically for the manufacture of a printing block on a stamp plate blank made of a porous thermoplastic material, is for instance known from EP 805 745 B1. In said technique, a stamp plate blank is put into an exposure apparatus along with a pattern (stencil) or a mask which has been produced for instance with the aid of a computer and which comprises the desired stamp imprint image. Normally, as a supporting "table" a glass plate is used in the exposure apparatus, against which the unit consisting of the stencil and the stamp plate blank is pressed by means of a pressing element with the aid of a cover lid. Special stamp plate materials for said flash method are for instance also known from EP 810 100 B1.

Regarding the use of the above-mentioned flash apparatus, in practice experience has shown that when a larger number of stamp plate blanks is exposed, i.e. when a corresponding number of finished stamp plates is manufactured according to the flash method, quite rapidly an overheating occurs in the region where the stamp plate blanks are inserted, i.e. in particular of the glass plate support. If it is not noticed, such an overheating can cause that in the regions of the stamp plate where the pores shall remain open, already an unintentional closing of pores is effected simply in consequence of the insertion and compression, i.e. the closing of the lid, namely by the hot glass support, wherein, moreover, such a partial closing of the pores may perhaps not be noticed so that unsuitable stamp plates are produced. In the more favorable case, when such overheatings are noticed, adverse waiting times are necessary in order to allow the apparatus or its relevant parts to cool down again, which is time-consuming and makes the manufacturing of a series of stamp plates more complicated.

SUMMARY OF INVENTION

It is now an object of the present invention to overcome this disadvantage and to propose an apparatus of the initially defined kind by means of which also large series of stamp plates can be manufactured with the aid of the described flash technology in short times.

Accordingly, in an aspect of the present invention, the glass plate support is formed by means of two glass plates arranged on top of each other in a spaced apart manner, thereby forming a gap between them.

Thus, in the present apparatus which, in principle, comprises in a conventional manner an exposure lamp and a glass plate support above said exposure lamp for a stamp plate blank within a housing, the glass plate support is formed with (at least) two glass plates arranged spaced apart from each other, thereby forming a gap there-between; in the operating position, said glass plates are arranged one above the other, and the (air) gap between said glass plates acts as an isolation in order to keep the heat developed by the exposure lamp and leading to the heating of the lower glass plate away from the upper glass plate and, consequently, from the stamp plate blank placed thereupon.

In connection therewith, according to a preferred embodiment of the inventive apparatus, there is arranged in the housing at least one cooling air fan, so that in the area of the exposure lamp, a cooling air path is provided. Thus, in addition, also the region of the exposure lamp is cooled by the cooling air transported by means of the fan through said region so that also the lower glass plate is cooled, which in addition to the above-mentioned isolating gap helps to reliably avoid an overheating of the upper glass plate.

Tests have shown that a particularly efficient cooling is rendered possible with small fan constructions having a flat design, if the housing is provided on two opposing sides with a respective fan, wherein one of the fans or blowers is a pressure fan and the other one is a suction fan. In this connection, the two fans on the opposing sides of the housing can be designed in such a flat manner that practically no increase of the width of the apparatus results from the mounting of the fans. Nevertheless, the added-up pressing and suction effects can lead to an adequate throughput of cooling air in the region of the exposure lamp and of the lower glass plate.

Preferably, at the fan or at each fan an air filter is provided in order to keep the space in question in the area of the exposure lamp free of any particles, which is of importance because such particles could be reproduced ('imaged') undesirably on the stamp plate blank during "flashing": Therein, in regions where a closing of pores is desired, partial regions with pores which remain open could be caused as a result of the "shading" due to said particles.

For a protection of the fan or of each fan and, if necessary, also of the air filter, it is furthermore beneficial if a cover mounted laterally at the housing is allocated to the or each fan, said cover defining an air channel.

An advantageous embodiment of the present apparatus is further characterized in that the two glass plates are of different thicknesses, wherein the thinner glass plate is provided adjacent to the exposure lamp as a protection therefor and the thicker glass plate is provided as a support for the blank. In this connection, the thicker glass plate can have a thickness of approximately 8 mm, wherein a sufficient strength with respect to the contact pressure during pressing of the stamp plate blank and of the stencil may be obtained. The thinner glass plate can be substantially thinner, it can for instance have a thickness of only approximately 2 mm, as it is not subject to such mechanical stresses.

The distance between the two glass plates arranged one above the other can for instance be approximately 2 mm, wherein on the one hand a sufficient isolation effect is obtained and on the other hand a low design of the apparatus and a simplification of the holding devices for the glass plates are rendered possible.

For a particularly efficient operation of the present apparatus it is also advantageous if the gap between the glass plates forms a further cooling air path. In this manner, the gap between the glass plates does not only act as an isolation but is also additionally cooled so that the upper glass plate and, consequently, the stamp plate blanks placed thereupon are always kept in the admissible temperature range in a particularly easy manner.

The glass plates can be made of any transparent material, in particular of acrylic glass.

SHORT DESCRIPTION OF THE DRAWINGS

In the following, the invention will be explained in even more detail by way of preferred embodiments which are illustrated in the drawings, yet without being limited to said embodiments. In detail, in the drawings.

DETAILED DESCRIPTION OF THE PREFERRED EMBODIMENTS

Figure 1:
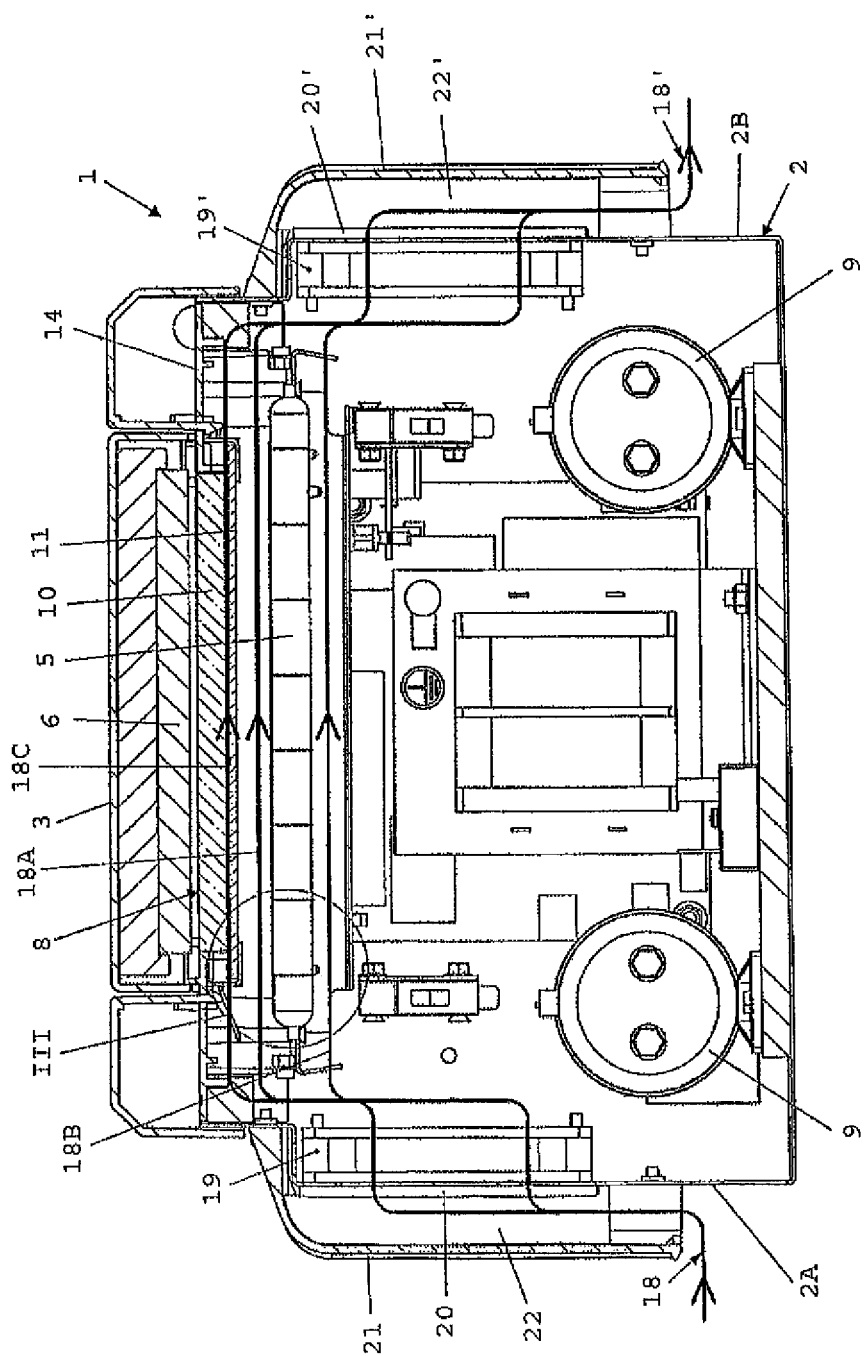
FIG. 1 shows a cross-section through an apparatus for manufacturing stamp printing blocks by a local exposure and heating of a stamp plate blank, said apparatus shortly being called "flash apparatus" hereinafter, wherein also a cooling scheme in the form of cooling air paths is illustrated.
Figure 2:
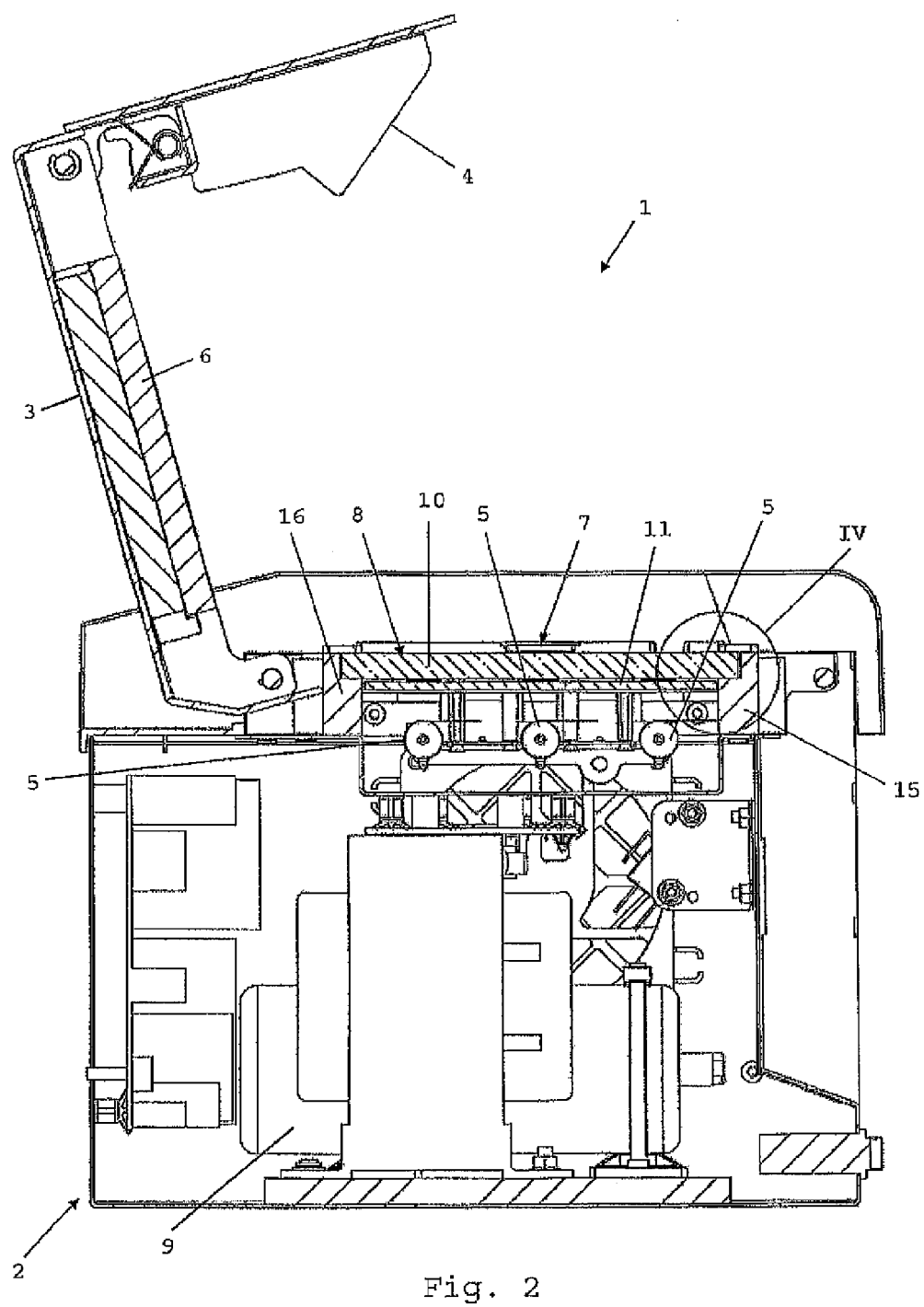
FIG. 2 shows a longitudinal section through such a flash apparatus, with the lid being opened.

In FIG. 1 and FIG. 2 there is shown a flash apparatus 1 which in gerneral is of a conventional structure as far as the basic construction as well as the electric control and power supply of the exposure means is concerned so that the description with respect thereto can be kept short.

The apparatus 1 comprises a housing 2 at the upper side of which a hinged lid 3 is mounted such that it can be pivoted. Said hinged lid 3 is provided with a hinged front locking mechanism 4 which, in the closing position of the lid 3 (which is shown in cross-section in FIG. 1), cooperates in a conventional manner with corresponding locking elements at the front of the housing 2 (not illustrated in further detail). In particular, in this connection also a conventional safety mechanism can be installed which enables an activation of the exposure means, here in the form of three exposure or flash lamps 5 (see FIG. 2; in the cross-section according to FIG. 1 only one of said exposure lamps 5 is visible) only in the closed position of the lid 3.

At its inner side, the lid 3 is provided with a pressing part or pressing-on part 6 which is preferably provided such that it is replaceable and which, in the closed state of the lid 3 (see FIG. 1), presses a stamp plate blank 7 (see FIG. 2) against a glass plate support 8. In this connection, between the blank 7 and the support 8 a pattern, stencil or mask which is not recognizable in more detail in the drawing is arranged which has been produced for instance with the aid of a computer and which determines the form of the printing block which is created at the lower side of the blank 7 (according to the representation in FIG. 1 and FIG. 2) during the "flashing" process by a local closing of pores of the blank 7 consisting of a corresponding foam material. Hence, the stencil masks regions of the lower side of the blank 7, and in said masked regions the foam material is left unchanged with the opening-out pores, which is known per se in the flashing process, so that later, when the stamp plate is used, at said points the stamping ink can pass through the porous foam material of the stamp plate in order to generate an imprint or impression on the respective substrate or document. In other regions, the stencil or mask leaves the lower surface of the stamp plate blank 7 free or 'uncovered' so that those regions are "flashed", i.e. irradiated with high-energy light, when the exposure lamps 5 are activated, wherein the energy is so high that the foam material is heated such that the pores of the blank 7 will be closed by welding at these points. As a consequence thereof, no ink can permeate at said points or regions in the finished stamp plate so that at those points or regions, no ink imprint (impression) will be created on the substrate or document during stamping.

Said technology is known per se and, therefore, here requires no further explanation. It shall only be mentioned that in the present apparatus 1 correspondingly highly dimensioned electrolytic capacitors 9 are provided for the generation of the high energies during the flashing process, which capacitors are charged by a corresponding customary electric circuit which is not illustrated in more detail here, and which are discharged during the flashing process.

Experience has shown that in the past, by said high-energy radiation during the flashing process, a—single—glass plate support 8—according to prior art—was heated up relatively quickly so that a flashing of larger numbers of stamp plate blanks 7 was impossible; i.e. after the manufacturing of some few stamp plates it had to be waited patiently until the glass plate support 8 had cooled down again before the next blanks 7 could be flashed.

Figure 3:
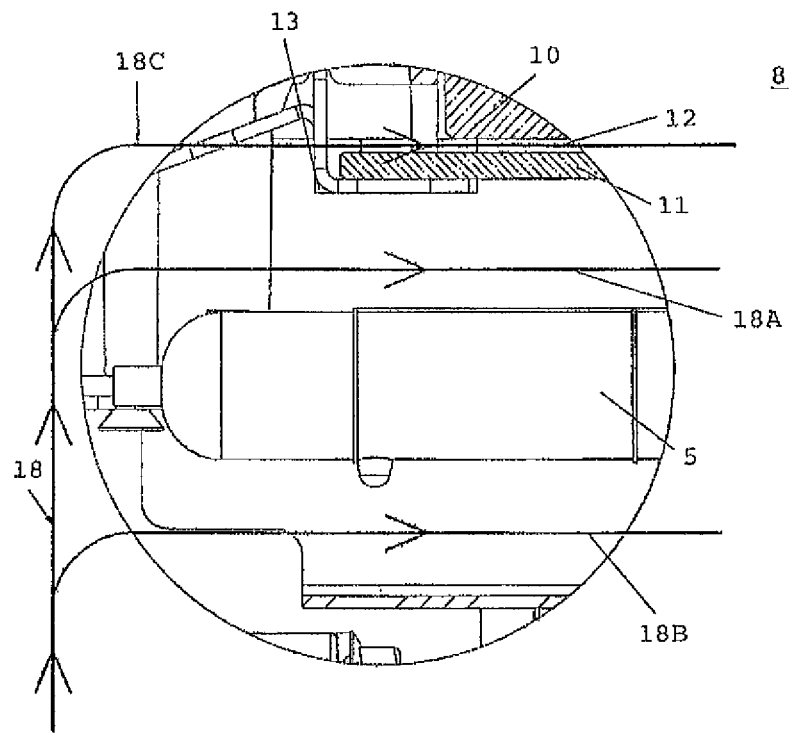
FIG. 3 shows a detail III according to FIG. 1 for the illustration of the gap between the two glass plates of the glass plate support and of the cooling air paths.
Figure 4:
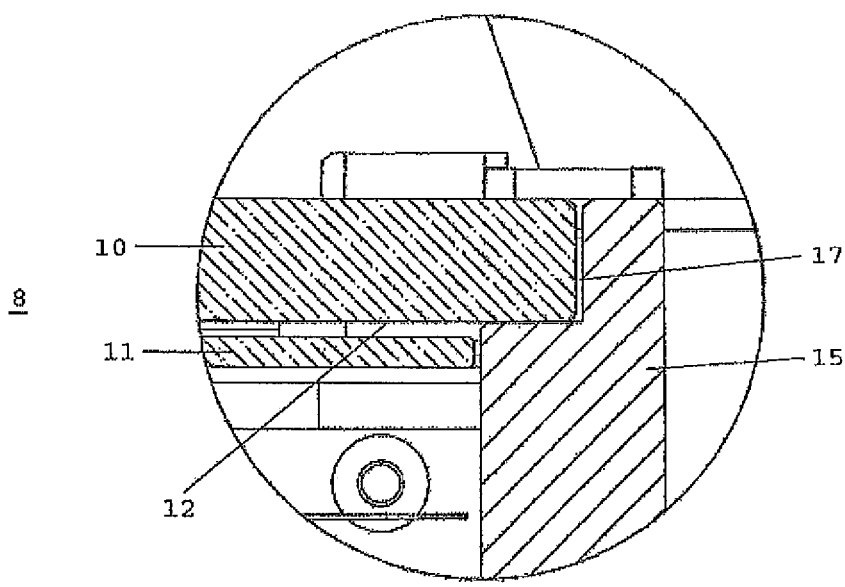
FIG. 4 shows the detail IV according to FIG. 2 for the illustration of the resting of the upper thicker glass plate on a frame within the housing of the flash apparatus.

In order to solve this problem, in the present apparatus 1 the glass plate support 8 is formed by means of two glass plates 10, 11 which are arranged on top of each other and in parallel to each other, see in this respect in particular also the detail drawings of FIG. 3 and FIG. 4 which are reproduced on a larger scale. Thus, between the two glass plates 10 and 11 there is formed a gap 12 which has a highly isolating effect. This results in that, although the lower glass plate 11 is still heated during the flashing process, the upper glass plate 10 is not heated to such a high extent during the flashing operation so that stamp plate blanks 7 can be flashed at a high rate, i.e. in large numbers of items, in order to produce the desired stamp plate printing blocks.

As can be seen in detail from FIG. 3, the lower glass plate 11 is mounted on angle bars 13 extending laterally at the upper side of the housing, wherein said angle bars are attached at the cover wall 14 of the housing 2 (or, where appropriate, are integrally formed therewith, for example from a bent sheet metal); compare FIG. 1.

On the other hand, the upper glass plate 10 is supported on front and rear supporting bars 15, 16 which are also attached at the upper side of the housing 2 and which are provided with stepped shoulders 17 for the support of the glass plate 10; see in particular FIG. 2 and FIG. 4.

The upper glass plate 10 is relatively thick, wherein its thickness can for instance be approximately 8 mm. In contrast thereto, the lower glass plate 11 is relatively thin, for instance with a thickness of approximately 2 mm. The distance between the two glass plates 10 and 11, i.e. the height of the gap 12, can for instance be approximately 1 mm. Tests have shown that with this distance of 1 mm, i.e. with a height of the gap 12 of approximately 1 mm, already a sufficient isolating effect can be obtained with regard to the desired temperature behavior at the upper side of the upper glass plate 10.

Said temperature behavior is further improved, if, as is evident from FIG. 1 and FIG. 3, cooling air 18 from outside the housing 2 (see FIG. 1) is transported through the upper region of the housing 2. Said cooling air flow is for instance effected with the aid of two fans 19, 19' which lie opposite to each other and are arranged laterally at the housing 2, wherein the one fan 19 presses the cooling air 18 into the interior of the housing 2, i.e. acts as a pressure fan or blower, whereas the other fan 19' on the opposite side of the housing 2 sucks in the cooling air from the inside of the housing 2 and leads the cooling air in an air flow 18' to the outside, i.e. said fan 19' acts as a suction fan.

Inside the housing 2 the cooling air flow 18 is primarily branched into partial flows, i.e. cooling air paths 18A, 18B, which are used for the cooling of the exposure or flash lamps 5. A further partial cooling air flow or partial cooling air path 18C passes through the gap 12 between the two glass plates 10 and 11 and thereby assists additionally in maintaining the temperature (keeping cool) of the upper glass plate 10.

It is certainly conceivable that the cooling air within the inside of the housing is only guided along the path 18C, or only along the path 18A, or only along the paths 18A and 18C, or only along the paths 18A and 18B, wherein in each case already an improved temperature behavior is achieved. It is also possible to provide only one fan, e.g. the fan 19, in order to transport cooling air through the housing 2 and its upper area. For a compact construction of the flash apparatus 1 as a whole, however, it has proved to be advantageous when two fans 19, 19' with a flat design are used, even when each fan only has a relatively low throughput rate, as then the fan performances are added up.

Furthermore, to each fan 19 or 19' there is allocated an air filter 20 or 20' at the outside in order to filter the sucked-in air. In this connection the air filter 20' at the fan 19' is also advantageous insofar as, where appropriate, the circulation direction and thus also the transporting direction of the cooling air can be reversed, wherein then the fan 19' acts as a pressure fan and the fan 19 acts as a suction fan.

Moreover, in the region of the two fans 19, 19' there is provided a cover 21 or 21', respectively, at the housing 2 which defines an air channel 22 or 22' between the respective cover and the respective side wall of the housing. It goes without saying that in the respective side wall 2A or 2B there is provided a corresponding, for instance circular, cutout at the location of the fan 19 or 19' in order to enable the air passage; this is, however, not illustrated in further detail in the drawing, as the provision of such a cutout is a quite usual thing.

While the invention has been explained above by means of preferred embodiments, also further variations and modifications are possible without leaving the scope of the present invention. It is for instance conceivable that as a glass plate support 8 more than two spaced apart glass plates are provided, for example three glass plates, with respective gaps between them. The "glass" plates can consist of any suitable transparent material, for instance of acrylic glass, but also of quartz glass, etc. For the guiding of the cooling air inside the housing, there can also be provided guiding surfaces (guiding plates or baffles).

The invention claimed is:

1. A flash apparatus for manufacturing stamp printing blocks by local exposure and heating of a stamp plate blank made of a porous thermoplastic material, said flash apparatus comprising at least one exposure lamp which is arranged in a housing beneath a glass plate support for the blank, wherein the glass plate support is formed with two glass plates which are arranged one above the other in a spaced apart relationship, thereby forming a gap between them, wherein at least one two cooling air fans are mounted in the housing at two opposite sides thereof, wherein one of the fans is provided as a pressure fan and the other one is provided as a suction fan, and a first cooling air path is provided between the two cooling air fans in the area of the exposure lamp, and wherein the gap between the glass plates forms a second cooling air path between the two cooling air fans, said first and second cooling air paths being arranged in parallel between the two cooling air fans.

2. The flash apparatus according to claim 1, wherein at each fan, an air filter is provided.

3. The flash apparatus according to claim 1, wherein to each fan, a cover is allocated which is mounted laterally at the housing, said cover defining an air channel.

4. The flash apparatus according to claim 1, wherein the two glass plates have different thicknesses, wherein the thinner glass plate is provided adjacent to the exposure lamp as a protection therefor, and the thicker glass plate is provided as a support for the blank.

5. The flash apparatus according to claim 4, wherein the thicker glass plate has a thickness of approximately 8 mm.

6. The flash apparatus according to claim 4, wherein the thinner glass plate (11) has a thickness of approximately 2 mm.

7. The flash apparatus according to claim 1, wherein the distance between the glass plates is approximately 1 mm.

* * * * *